United States Patent

Onda et al.

[11] Patent Number: 5,596,211
[45] Date of Patent: Jan. 21, 1997

[54] FIELD EFFECT TRANSISTOR HAVING A GRADED BANDGAP INGAASP CHANNEL FORMED OF A TWO-DIMENSIONAL ELECTRON GAS

[75] Inventors: Kazuhiko Onda; Masaaki Kuzuhara, both of Tokyo, Japan

[73] Assignee: NEC Corporation, Tokyo, Japan

[21] Appl. No.: 544,724

[22] Filed: Oct. 18, 1995

Related U.S. Application Data

[63] Continuation of Ser. No. 181,029, Jan. 14, 1994, abandoned.

[30] Foreign Application Priority Data

Jan. 14, 1993 [JP] Japan .................................. 5-004473

[51] Int. Cl.$^6$ ............................................................. H01L 35/26
[52] U.S. Cl. ........................... 257/194; 257/191; 257/190
[58] Field of Search ................................ 257/191, 194, 257/190

[56] References Cited

U.S. PATENT DOCUMENTS

| | | | |
|---|---|---|---|
| 4,631,566 | 12/1986 | Campbell et al. | 257/186 |
| 5,099,295 | 3/1992 | Ogawa | 257/194 |
| 5,206,527 | 4/1993 | Kuwata | 257/192 |
| 5,285,087 | 2/1994 | Narita et al. | 257/190 |
| 5,371,387 | 12/1994 | Ando | 257/194 |
| 5,373,168 | 12/1994 | Ando et al. | 257/191 |
| 5,412,230 | 5/1995 | Nakagawa | 257/191 |

FOREIGN PATENT DOCUMENTS

| | | | |
|---|---|---|---|
| 1-14972 | 1/1989 | Japan | 257/191 |
| 2-60223 | 12/1990 | Japan. | |
| 5-121453 | 5/1993 | Japan. | |

OTHER PUBLICATIONS

Anonymous, "Si/SiGe Heterostructure MoS Devices with Step Graded Bandgap Profile of the SiGe Channel", *IBM Technical Disclosure Bulletin*, vol. 36, No. 3, Mar. 1993, pp. 127–129.

Sze, S. M., Semiconductor Physics, 1985, pp. 267–268.

Shieh et al., "A High Performance S–Doped GaAs/$In_xGa_{1-x}As$ Pseudomorphic High Electron Mobility Transistor Utilizing a Graded $In_xGa_{1-x}As$ Channel", IEEE Electron Device Letters, vol. 14, No. 12, Dec. 1993, pp. 581–583.

By W. Hong et al., "High–Breakdown, High–Gain InAlAs/InGaAsP Quantum–Well HEMT's", Oct. 1991, vol. 12, No. 10, IEEE Electron Device Letters, pp. 559–561.

By T. Akazaki et al., "Improved InAlAs/InGaAs HEMT Characteristics by Inserting an InAs Layer into the InGaAs Channel", Jun. 1992, vol. 13, No. 6, IEEE Electron Device Letters, pp. 325–327.

*Primary Examiner*—Jerome Jackson, Jr.
*Assistant Examiner*—John Guay
*Attorney, Agent, or Firm*—Young & Thompson

[57] ABSTRACT

A two dimensional electron gas field effect transistor comprising a buffer layer, a channel layer and an N-type electron supply layer formed on a semi-insulating, InP substrate in the named order. The channel layer is formed of an $In_{1-x}Ga_xAs_yP_{1-y}$ layer, the composition ratios "x" and "y" changing in a depth direction.

4 Claims, 4 Drawing Sheets

(a)
- 8 SOURCE ELECTRODE
- 10 GATE ELECTRODE
- 9 DRAIN ELECTRODE
- 7 N - $In_{0.53}Ga_{0.47}As$ LAYER
- 6 I - $In_{0.52}Al_{0.48}As$ LAYER
- 5 N - $In_{0.52}Al_{0.48}As$ LAYER
- 4 I - $In_{0.52}Al_{0.48}As$ LAYER
- 3 I - TYPE GRADED $In_{1-x}Ga_xAs_yP_{1-y}$ LAYER
- 2 I - $In_{0.52}Al_{0.48}As$ LAYER
- 1 SEMI-INSULATING InP SUBSTRATE (a)
- 8 SOURCE ELECTRODE
- 10 GATE ELECTRODE
- 9 DRAIN ELECTRODE
- 7 N - $In_{0.53}Ga_{0.47}As$ LAYER
- 6 I - $In_{0.52}Al_{0.48}As$ LAYER
- 5 N - $In_{0.52}Al_{0.48}As$ LAYER
- 4 I - $In_{0.52}Al_{0.48}As$ LAYER
- 3B I - $In_{1-x_2}Ga_{x_2}As_{y_2}P_{1-y_2}$ LAYER
- 3A I - $In_{1-x_1}Ga_{x_1}As_{y_1}P_{1-y_1}$ LAYER
- 2 I - $In_{0.52}Al_{0.48}As$ LAYER
- 1 SEMI-INSULATING InP SUBSTRATE

InGaAsP CHANNEL DEPTH →

(a)
- 8 SOURCE ELECTRODE
- 10 GATE ELECTRODE
- 9 DRAIN ELECTRODE
- 7 N - $In_{0.53}Ga_{0.47}As$ LAYER
- 6 I - $In_{0.52}Al_{0.48}As$ LAYER
- 5 N - $In_{0.52}Al_{0.48}As$ LAYER
- 4 I - $In_{0.52}Al_{0.48}As$ LAYER
- 3D I - TYPE GRADED $In_{1-x}Ga_xAs_yP_{1-y}$ LAYER
- 2 I - $In_{0.52}Al_{0.48}As$ LAYER
- 1 SEMI-INSULATING InP SUBSTRATE (a)

- 8 SOURCE ELECTRODE
- 10 GATE ELECTRODE
- 9 DRAIN ELECTRODE
- 7 N - $In_{0.53}Ga_{0.47}As$ LAYER
- 6 I - $In_{0.52}Al_{0.48}As$ LAYER
- 5 N - $In_{0.52}Al_{0.48}As$ LAYER
- 4 I - $In_{0.52}Al_{0.48}As$ LAYER
- 3C I - $In_{1-x_3}Ga_{x_3}As_{y_3}P_{1-y_3}$ LAYER
- 3B I - $In_{1-x_2}Ga_{x_2}As_{y_2}P_{1-y_2}$ LAYER
- 3A I - $In_{1-x_1}Ga_{x_1}As_{y_1}P_{1-y_1}$ LAYER
- 2 I - $In_{0.52}Al_{0.48}As$ LAYER
- 1 SEMI-INSULATING InP SUBSTRATE

InGaAsP CHANNEL DEPTH ⟶

FIELD EFFECT TRANSISTOR HAVING A GRADED BANDGAP INGAASP CHANNEL FORMED OF A TWO-DIMENSIONAL ELECTRON GAS

This application is a continuation of application Ser. No. 08/181,029, filed Jan. 14, 1994, now abandoned.

BACKGROUND OF THE INVENTION

1. Field of the Invention

The present invention relates to a field effect transistor formed of a compound semiconductor, which is satisfactorily operable in a millimeter wave band at which a field effect transistor formed of Si (silicon) is no longer operable. More specifically, the present invention relates to a 2DEG·FET (two-dimensional electron gas field effect transistor) having a channel formed of a two-dimensional electron gas created at a heterojunction.

2. Description of Related art

Recently, attention has been focused on ternary or quaternary mixed crystalline compound semiconductors such as InGaAs and InGaAsP. Among them, InGaAs which is in lattice matching with an InP substrate is promising not only as a material for photo devices but also as a material for various types of field effect transistors (FET). In particular, research for FETs utilizing a two-dimensional electron gas created at a heterojunction between an InP layer and an InAlAs layer has become extensive.

The reason for which InGaAs is considered to be more promising than GaAs as an electron transportation device material is that: (1) a peak value of an electron drift mobility is large; (2) an electron mobility in a low electric field is large.; (3) it is easy to form an ohmic contact and therefore a contact resistance is low (a barrier between InGaAs and a metal is low): (4) a larger overshoot of the electron mobility is expected under a high electric field; and (5) a diffusion noise caused by electron transition between a Γ alley and a L valley is small.

At present, a FET utilizing a two-dimensional electron gas created at an InGaAs/InAlAs boundary is considered to be promising as a high performance millimeter wave device, and is now being actively studied in various organizations. It has been already confirmed at an experience level that it is effective as a low-noise device.

For example, K. H. Dub et al reported that at a room temperature, the noise figure at 94 GHz is 1.2 dB, and the associated gain 7.2 dB ("IEEE MICROWAVE AND GUIDED WAVE LETTERS", Vol. 1, No. 5, pp 114–116, May, 1991 ). This reported device was formed on an experimental basis by using a compound in lattice matching with an InP substrate, namely, by adjusting the composition ratio of In to $In_{0.53}Ga_{0.47}As/In_{0.52}Al_{0.48}As$. This heterojunction creates a two-dimensional electron gas in the $In_{0.53}Ga_{0.47}As$ layer.

In order to further elevate the characteristics, for example, G. I Ng et al reported that the characteristics of the FET is improved by making the "In" composition ratio in the InGaAs layer larger than 0.53 ("IEEE ELECTRON DEVICE LETTERS", Vol. 10, No. 3, pp 114–116, June, 1989). However, if InGaAs having the "In" composition ratio of 0.53 or more is formed on the InP substrate, a lattice mismatching occurs. Therefore, the thickness allowing a single crystal growth is restricted by the "In" composition ratio, and accordingly, the thickness of the InGaAs channel layer is limited.

In addition, T. Akazaki et al reported the FET which creates a two-dimensional electron gas having a strong confinement effect, by inserting a thin InAs layer into the InGaAs channel ("IEEE ELECTRON DEVICE LETTERS", Vol. 13, No. 6, pp 325–327, June, 1992).

From a different viewpoint, it is difficult to make an In-based material have a high resistance, and since a Schottky barrier height φB at a Schottky junction is low, a property withstanding an applied voltage is lower than a GaAs-based material, and therefore, an operating voltage of the FET cannot be increased.

In order to increase the breakdown voltage, it may be considered to use a large energy gap material in the channel layer. The energy gap Eg of $In_{0.53}Ga_{0.47}As$ in lattice matching with InP is 0.74 eV. The energy gap Eg of InGaAs with InP can be changed from 0.74 eV to 1.35 eV, by changing its composition ratio but lattice matching cannot be maintained.

W. P. Hong et al reported an experimentally manufactured HEMT having a channel layer formed of InGaAsP and an electron supply layer formed of InAlAs ("IEEE ELECTRON DEVICE LETTERS", Vol. 12, No. 10, pp 559–561, October, 1991). In the reported device, the energy gap of $In_{0.73}Ga_{0.27}As_{0.6}P_{0.4}$ is 0.95 eV, which is larger than $In_{0.53}Ga_{0.47}As$ in lattice matching with InP, about 0.2 eV. Accordingly, it was reported that deterioration of the breakdown voltage caused by impact ionization it suppressed in a high electric field region, and a drain-source breakdown voltage of not less than 5 V and a gate-drain breakdown voltage of not less than 15 V were obtained.

W. P. Hong et al used InGaAsP as the electron passing channel layer, but in JP-B-02-60223 Sasaki et al proposed a FET having an electron supply layer formed of InGaAsP. In place of InAlAs used in the prior art, InGaAsP is used to form the electron supply layer, with the result that the conduction band discontinuity amount ΔEc between the InGaAsP electron supply layer and the InGaAs channel layer can be made small. Thus, an enhancement type FET was manufactured on an experimental basis.

As mentioned above, it is disadvantageous in that the breakdown voltage of the InAlAs/InGaAs heterojunction FET is low, and therefore, a large operating bias voltage cannot be used. On the other hand, since the InGaAsP channel layer has an energy gap larger than the conventional InGaAs channel layer, the deterioration of the FET breakdown voltage caused by the impact ionization is suppressed. However, the conduction band discontinuity amount ΔEc between the InAlAs electron supply layer and the InGaAsP channel layer can be made smaller than that between the InAlAs electron supply layer and the InGaAs channel layer, and therefore, a sheet electron density of the two-dimensional electron gas, where a quantum well is formed, becomes small. Therefore, there arises another problem that a sufficient carrier concentration cannot be obtained. Furthermore, since the conduction band discontinuity amount ΔEc is small, the effect of confining the two-dimensional electron gas is weaker than that of the prior art. As a result, the carriers leak to the InAlAs electron supply layer, and therefore, transconductance of the FET is deteriorated.

SUMMARY OF THE INVENTION

Accordingly, it is an object of the present invention to provide a two-dimensional electron gas field effect transistor which has overcome the above mentioned defect of the conventional one.

Another object of the present invention is to provide a two-dimensional electron gas field effect transistor having an InGaAsP channel layer, in which the drop of the two-dimesional electron gas carrier density in the InGaAsP channel layer and deterioration of the two-dimensional electron gas confining effect are eliminated, and which has an elevated breakdown voltage.

The above and other objects of the present invention are achieved in accordance with the present invention by a two-dimensional electron gas field effect transistor comprising a buffer layer, a channel layer and an N-type electron supply layer forested on a semi-insulating InP substrate in the named order, the channel layer being formed of $In_{1-x}Ga_xAs_yP_{1-y}$ layer, the composition ratios "x" and "y" changing in a depth direction.

With the above mentioned construction, the energy gap Eg of the non-doped $In_{1-x}Ga_xAs_yP_{1-y}$ channel layer can be monotonously or simply increased in the depth direction. Since the "Ga" composition ratio "x" and the "As" composition ratio "y" are large at a surface side, the conduction band discontinuity amount ΔEc at a heterojunction boundary between the InAlAs electron supply layer and the InGaAsP channel layer is large. Accordingly, in an operation under a low electric field, the carriers in the two-dimensional electron gas are concentrated at the surface having a large ΔEc, and therefore a sufficient sheet electron density can be obtained.

In accordance with the shifting of the FET operating region from the low electric field operation to a high electric field operation, electrons which have been accelerated in the two-dimensional electron gas and therefore have become hot, are moved to a substrate side where the composition ratios "x" and "y" gradually decrease. In addition, the impact ionization of the carriers which becomes a problem in the high electric field operation, has probability of generation which become small if the energy gap Eg becomes large. Accordingly, at the substrate side having a large energy gap Eg, the deterioration of the breakdown voltage caused by the impact ionization is effectively suppressed.

If the "Ga" composition ratio "x" and the "As" composition ratio "y" of $In_{1-x}Ga_xAs_yP_{1-y}$ are determined to meet with the following equation, $In_{1-x}Ga_xAs_yP_{1-y}$ can be lattice matched with the InP substrate.

$$x=0.453yx(1+0.031y)$$

Furthermore, the energy gap Eg is given by the following approximation equation:

$$Eg=1.35-0.72y+0.12y^2 \text{ (eV)}$$

The energy gap Eg of $In_{1-x}Ga_xAs_yP_{1-y}$ in lattice matching with InP can be caused to change from 0.75 eV to 1.35 eV, by changing its composition ratios "x" and "y". Therefore, deterioration of the breakdown voltage can be effectively suppressed by remarkably increasing the energy gap Eg in comparison with 0.75 eV of $In_{0.47}Ga_{0.53}As$ in lattice matching with InP.

In addition, distribution of the two-dimensional electron gas is not uniform in the channel layer. Probability of existence of electrons necessarily becomes low in the proximity of the boundary between the channel layer and the electron supply layer and in the proximity of the boundary between the channel layer and the substrate. Accordingly, even if the "In" composition ratio is not increased in these proximity regions, no large influence acts on the concentration of the two-dimensional electron gas and an effective drift velocity of electrons. Therefore, the "In" composition ratio of a middle portion in a thickness direction of the InCaAsP channel layer is preferably made larger than the surface side portion and the substrate side portion of the same channel layer. In other words, the middle portion is caused to have a composition of a small energy gap Eg, so that the electron concentration of the channel layer is increased and the mean drift velocity passing through the channel layer is elevated. Thus, an effect equivalent with the increase of the effective "In" composition ratio in the InGaAsP channel layer can be obtained.

The above and other objects features and advantages of the present invention will be apparent from the following description of preferred embodiments of the invention with reference to the accompanying drawings.

DESCRIPTION OF THE PREFERRED EMBODIMENTS

Figure 1A:
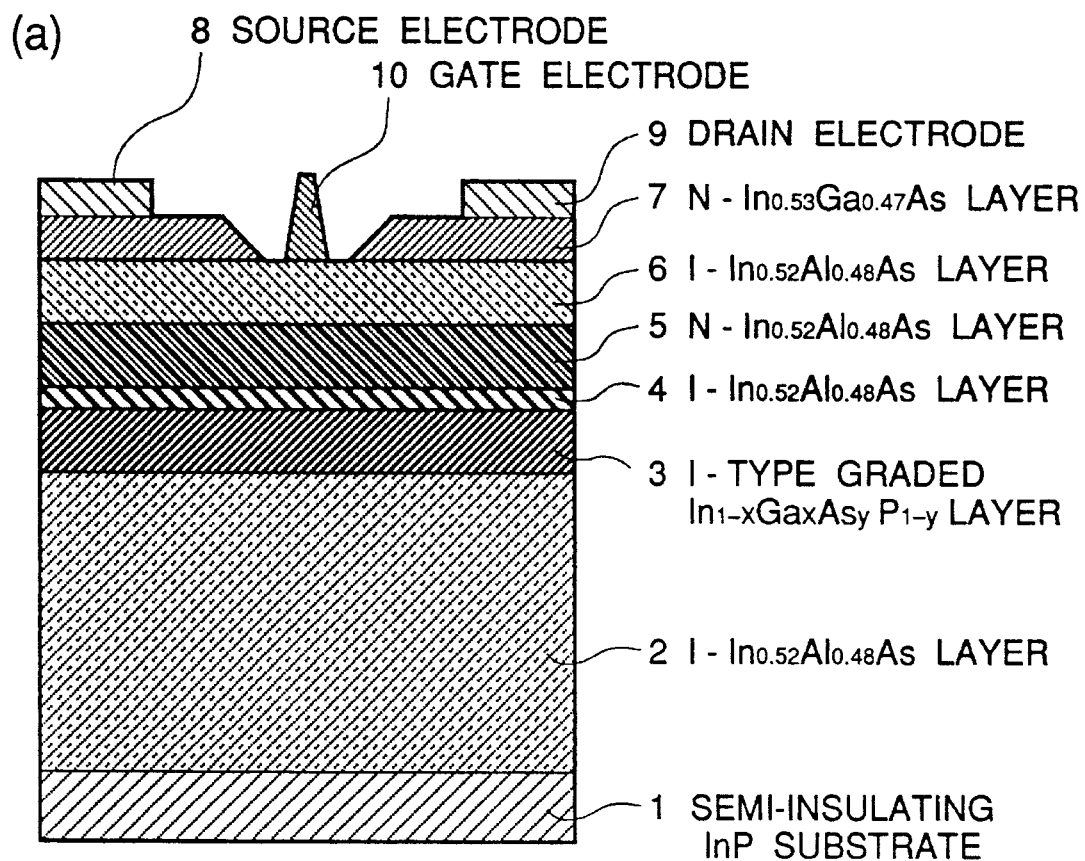
FIG. 1A is a diagrammatic sectional view of a first embodiment of the two-dimensional electron gas field effect transistor in accordance with the present invention.

Referring to FIG. 1A, there is shown a diagrammatic sectional view of a first embodiment of the two-dimensional electron gas field effect transistor in accordance with the present invention.

The shown embodiment has a semi-insulating InP substrate 1, on which there are grown in the named order by a MOCVD (metal organic chemical vapor deposition) process, a non-doped (I-type) $In_{0.52}Al_{0.48}As$ buffer layer 2 having its thickness of 500 nm, a non-doped $In_{1-x}Ga_xAs_yP_{1-y}$ channel layer 3 having its thickness of 50 nm, an $In_{0.52}Al0.48As$ spacer layer 4 having its thickness of 3 nm, an N-type $In_{0.52}Al0.48As$ electron supply layer 5 doped with Si (silicon) to have a concentration of $2\times10^{18}$ $cm^{-3}$ and having its thickness of 30 nm, a non-doped $In_{0.52}Al_{0.48}As$ Schottky layer 6 having its thickness of 20 nm and an N-type $In_{0.53}Ga_{0.47}As$ cap layer 7 doped with Si (silicon) to have a concentration of $2\times10^{18}$ $cm^{-3}$ and having its thickness of 30 nm.

Device isolation (not shown) is performed by a wet etching using a mixed liquid of a sulfuric acid and a hydrogen peroxide water. A source electrode 8 and a drain electrode 9 are formed in ohmic contact with the N-type InGaAs cap layer 7, by evaporating Au-Ge/Ni (gold-germanium/nickel) and performing an alloy heat-treatment. The N-type InGaAs cap layer 7 between the source electrode 8 and the drain electrode 9 is wet-etched so as to a recess where the non-doped InAlAs Schottky layer 6 is exposed and a gate electrode 10 of Ti-Pt-Au (titanium-platinum-gold) is formed in Schottky contact with the non-doped InAlAs Schottky layer 6 exposed in the recess.

Figure 1B:
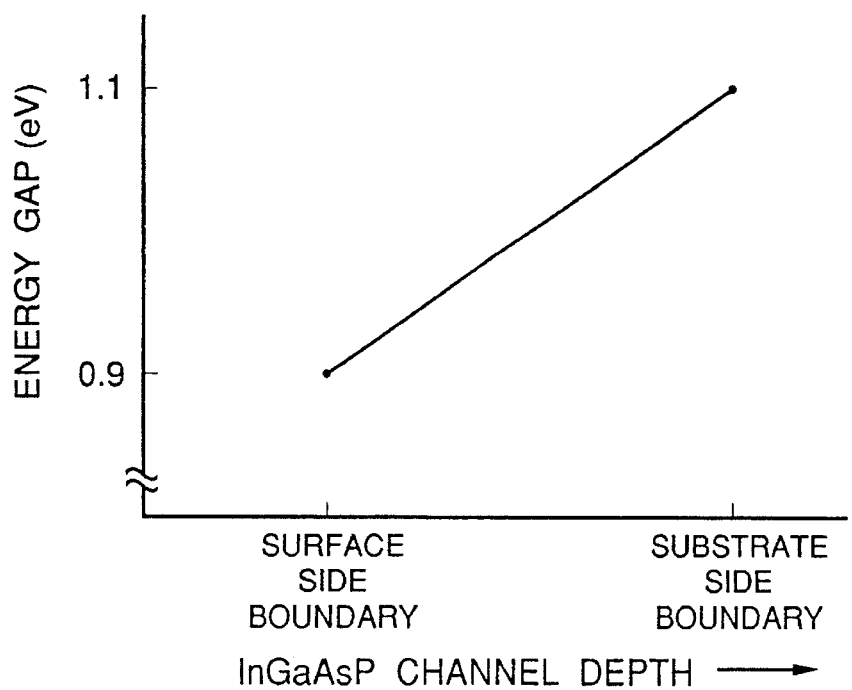
FIG. 1B is a graph illustrating the change of the energy gap in the depth direction, in the InGaAsP channel layer included in the field effect transistor shown in FIG. 1A.

In this embodiment, the non-doped $In_{1-x}Ga_xAs_yP_{1-y}$ channel layer 3 has a graded structure. As shown in a graph of FIG. 1B illustrating the change of the energy gap in the depth direction, in the InGaAsP channel layer 3, the composition ratios "x" and "y" are so set that the energy gap Eg simply and linearly increases from the surface side to the substrate side. Here, in order to prevent crystal defects, the composition ratios are also adjusted to meet the following condition for lattice matching with InP:

$x=0.453y\times(1+0.031y)$

For example, the composition ratios "x" and "y" are so modulated in the depth direction that the energy gap Eg of the non-doped $In_{1-x}Ga_xAs_yP_{1-y}$ channel layer 3 is 1.1 eV at the substrate side and 0.9 eV at the surface side, and the energy gap Eg linearly changes the depth direction between 1.1 eV and 0.9 eV. This desired energy gap pattern is obtained v&en the composition of the substrate side of the non-doped $In_{1-x}Ga_xAs_yP_{1-y}$ channel layer 3 is $In_{0.83}Ga_{0.17}As_{0.38}P_{0.62}$ and the composition of the surface side is $In_{0.67}Ga_{0.33}As_{0.71}P_{0.29}$.

Distribution of the two-dimensional electron gas created in the quantum well of the non-doped $In_{1-x}Ga_xAs_yP_{1-y}$ channel layer 3 has its center of gravity at the surface side adjacent to the N-type electron supply layer having a low conduction band energy. Accordingly, in a low electric field operation, the electrons pass at the surface side having a low "P" composition ratio. In a high electric field operation, however, the electrons, which have become hot, shifts its center of distribution to the substrate side adjacent the non-doped InAlAs buffer layer 2, the substrate side having a large electron mobility under a high electric field and a large "P" composition ratio. A high velocity operation is ensured by changing the center of electron distribution between the low electric field operation and the high electric field operation.

Figure 2A:
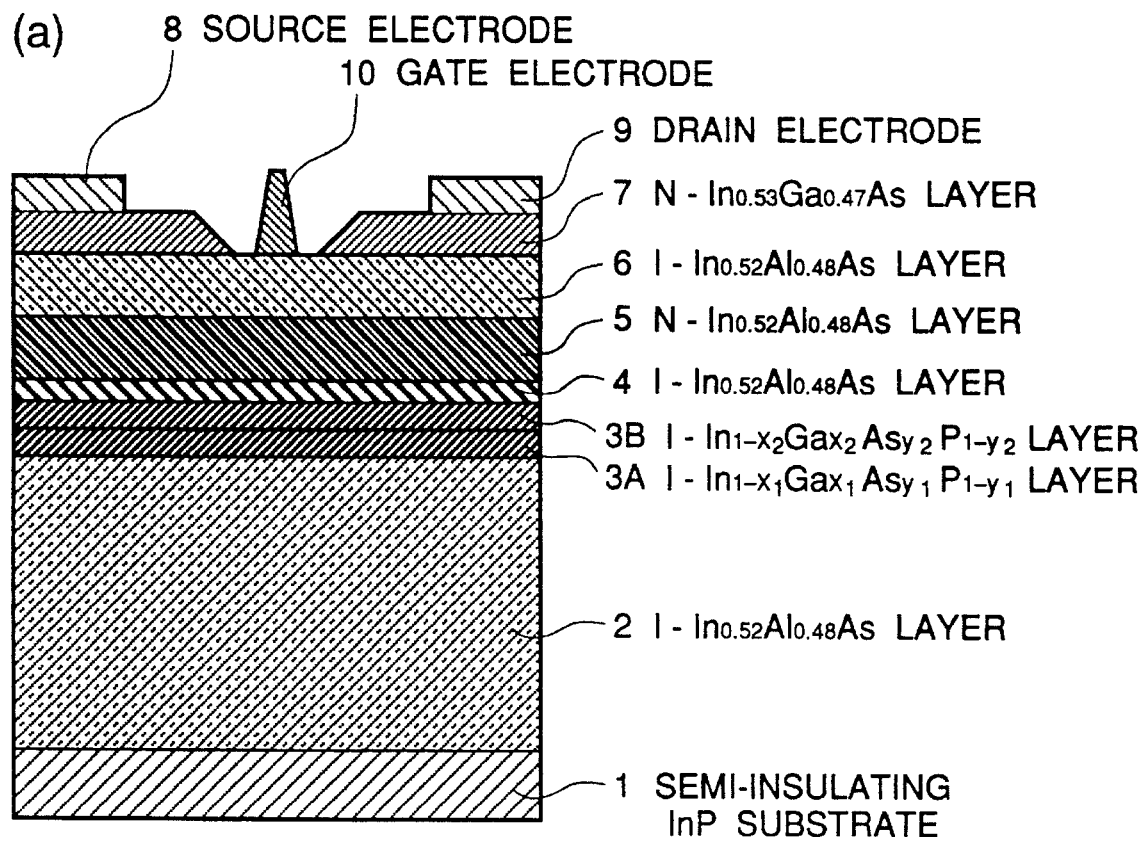
FIG. 2A is a diagrammatic sectional view of a second embodiment of the two-dimensional electron gas field effect transistor in accordance with the present invention.
Figure 2B:
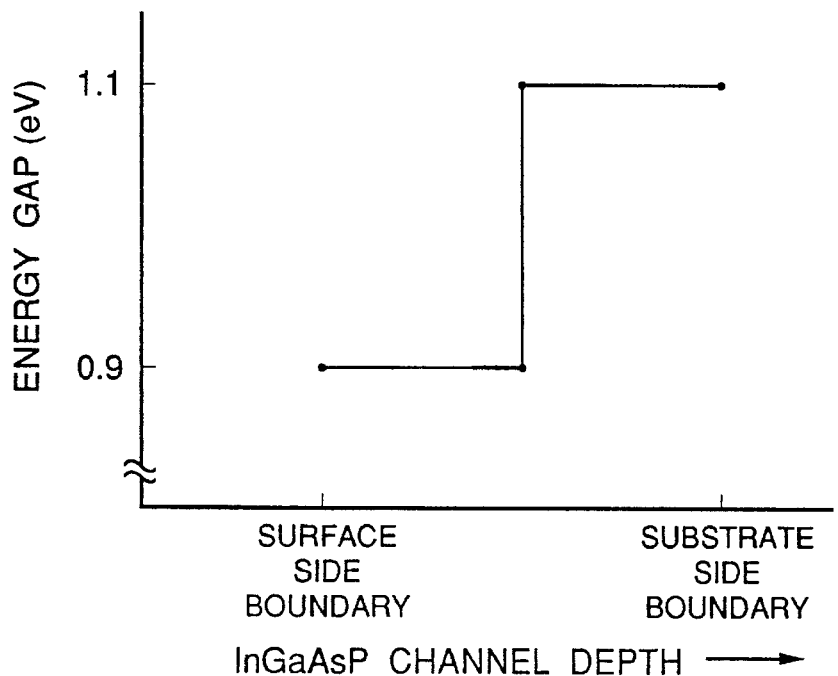
FIG. 2B is a graph illustrating the change of the energy gap in the depth direction, in the InGaAsP channel layer included in the field effect transistor shown in FIG. 2A.

Referring to FIG. 2A, there is shown a diagrammatic sectional view of a second embodiment of fine two-dimensional electron gas field effect transistor in accordance with the present invention. In FIG. 2A, elements similar to those shown in FIG. 1A are given the same Reference Numerals, and explanation thereof will be omitted.

The second embodiment is characterized in that the composition and the energy gap Eg of the channel layer change to have two steps in the depth direction. Namely, the channel layer is composed of a non-doped $In_{1-x1}Ga_{x1}As_{y1}P_{1-y1}$ channel layer 3A located at the substrate side and having its thickness of 25 nm and the energy gap Eg of 1.1 eV, and a non-doped $In_{1-x2}Ga_{x2}As_{y2}P_{1-y2}$ channel layer 3B located at the surface side and having its thickness of 25 nm and the energy gap Eg of 0.9 eV This second embodiment is the same as the first embodiment, excepting that in order to obtain the energy gap Eg of 1.1 eV, the composition of the substrate side non-doped InGaAsP channel layer 3A is $In_{0.83}Ga_{0.17}As_{0.38}P_{0.62}$, and in order to obtain the energy gap Eg of 0.9 eV, the composition of the surface side non-doped InGaAsP channel layer 3B is $In_{0.67}Ga_{0.33}As_{0.71}P_{0.29}$.

Namely, similarly to the first embodiment, the energy gap of the InGaAsP channel layer is larger in the substrate side than in the surface side.

In this second embodiment, the energy gap of the InGaAsP channel layer increases in two steps froth the surface side to the substrate side. However, a similar effect can be obtained if the energy gap of the InGaAsP channel layer increases in three or more steps from the surface side to the substrate side.

Figure 3A:
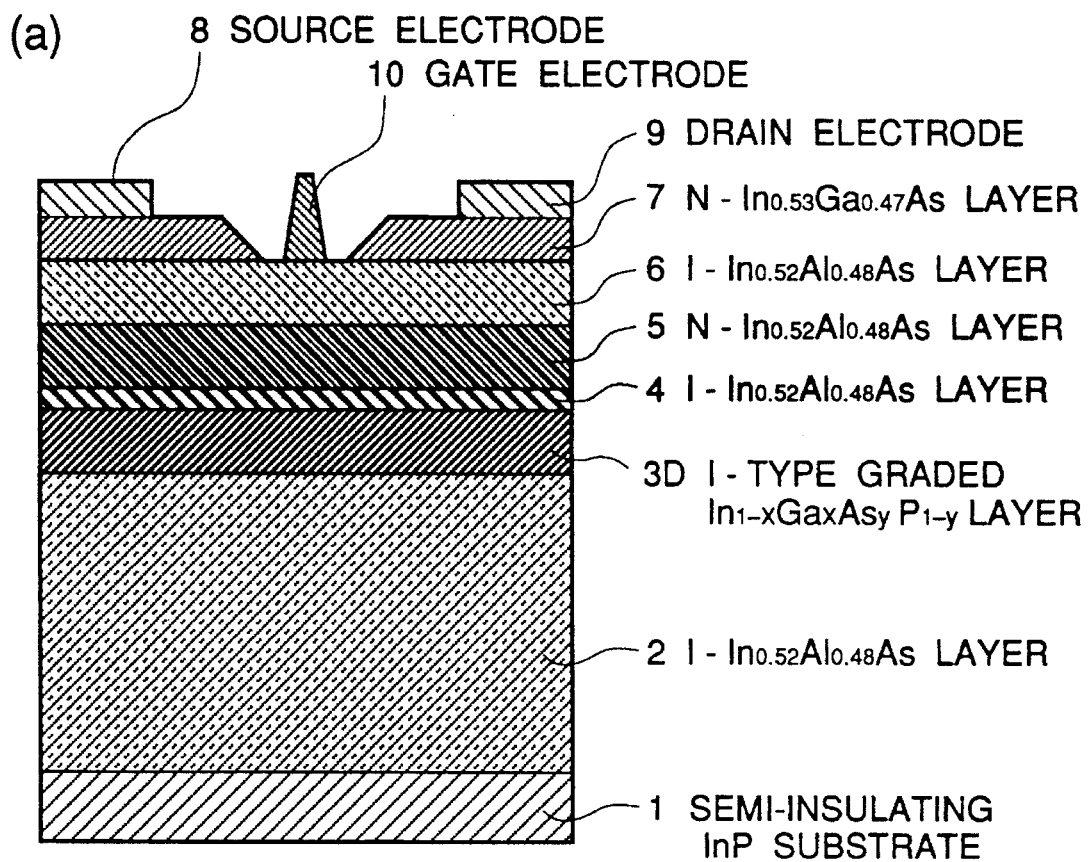
FIG. 3A is a diagrammatic sectional view of a third embodiment of the two-dimensional electron gas field effect transistor in accordance with the present invention.
Figure 3B:
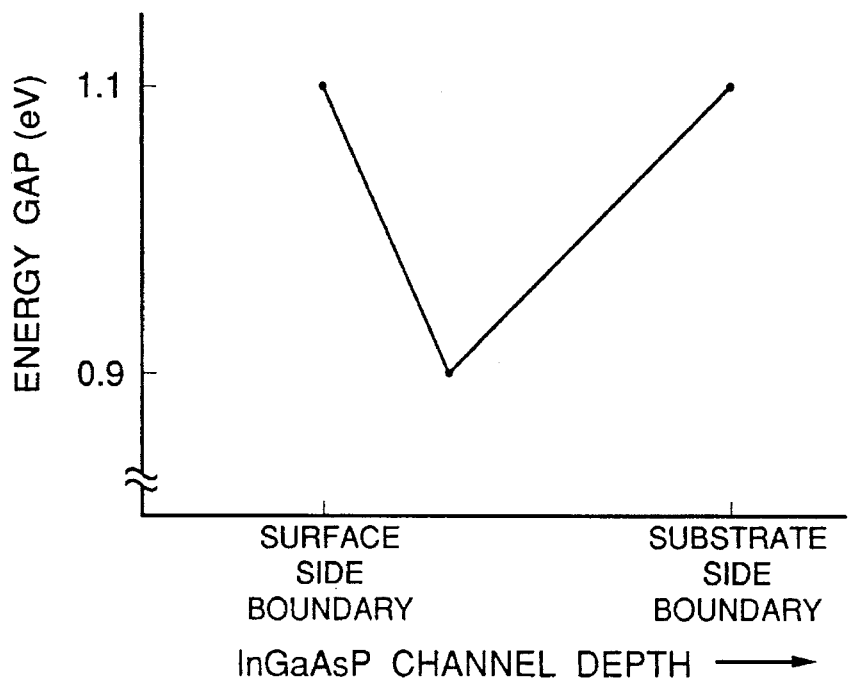
FIG. 3B is a graph illustrating the change of the energy gap in the depth direction, in the InGaAsP channel layer included in the field effect transistor shown in FIG. 3A.

Referring to FIG. 3A, there is shown a diagrammatic sectional view of a third embodiment of the two-dimensional electron gas field effect transistor in accordance with the present invention. In FIG. 3A, elements similar to those shown in FIG. 1A are given the same Reference Numerals, and explanation thereof will be omitted.

This third embodiment is different from the first embodiment in only the graded structure of a non-doped $In_{1-x}Ga_xAs_yP_{1-y}$ channel layer 3D provided in place of the non-doped $In_{1-x}Ga_xAs_yP_{1-y}$ channel layer 3. This non-doped InGaAsP channel layer 3D has its thickness of 50 nm, similarly to the non-doped InGaAsP channel layer 3. However, the composition ratios "x" and "y" of the non-doped InGaAsP channel layer 3D are so modulated in the depth direction that the energy gap Eg has a minimum value at a depth of 5 nm from the surface side and increases from its minimum value towards the substrate side and to the surface side.

The energy can Eg of the substrate side and the surface side of the non-doped InGaAsP channel layer 3D are 1.1 eV, and the minimum value of the energy gap Eg of the non-doped InGaAsP channel layer 3D (at a middle portion in the depth direction) is 0.9 eV. The energy gap Eg of 1.1 eV can be obtained by $In_{0.83}Ga_{0.17}As_{0.38}P_{0.62}$, and the energy gap Eg of 0.9 eV can be obtained by $In_{0.67}Ga0.33As_{0.71}P_{0.29}$. In this case, the center of electron distribution is positioned at an intermediate portion in the depth or thickness direction of the non-doped $In_{1-x}Ga_xAs_yP_{1-y}$ channel layer 3D.

In this embodiment, it is possible to form an excellent quantum well by sandwiching between a pair of lattice matching InGaAsP layers a strain superlattice layer having an extremely large "In" composition ratio within an extent generating no misfit dislocation. For another purpose it is possible to introduce a strain lattice in which the composition ratio of element or elements other than "In" is increased. In the low electric field operation, the electrons pass in a region having a high effective "In" composition ratio positioned at the intermediate portion of the channel layer. In the high electric field operation similarly to the first embodiment, the electrons which have become hot pass in the center of electron distribution at the substrate side adjacent to the non-doped InAlAs buffer layer 2, where the electron mobility is large under the high electric field.

Figure 4A:
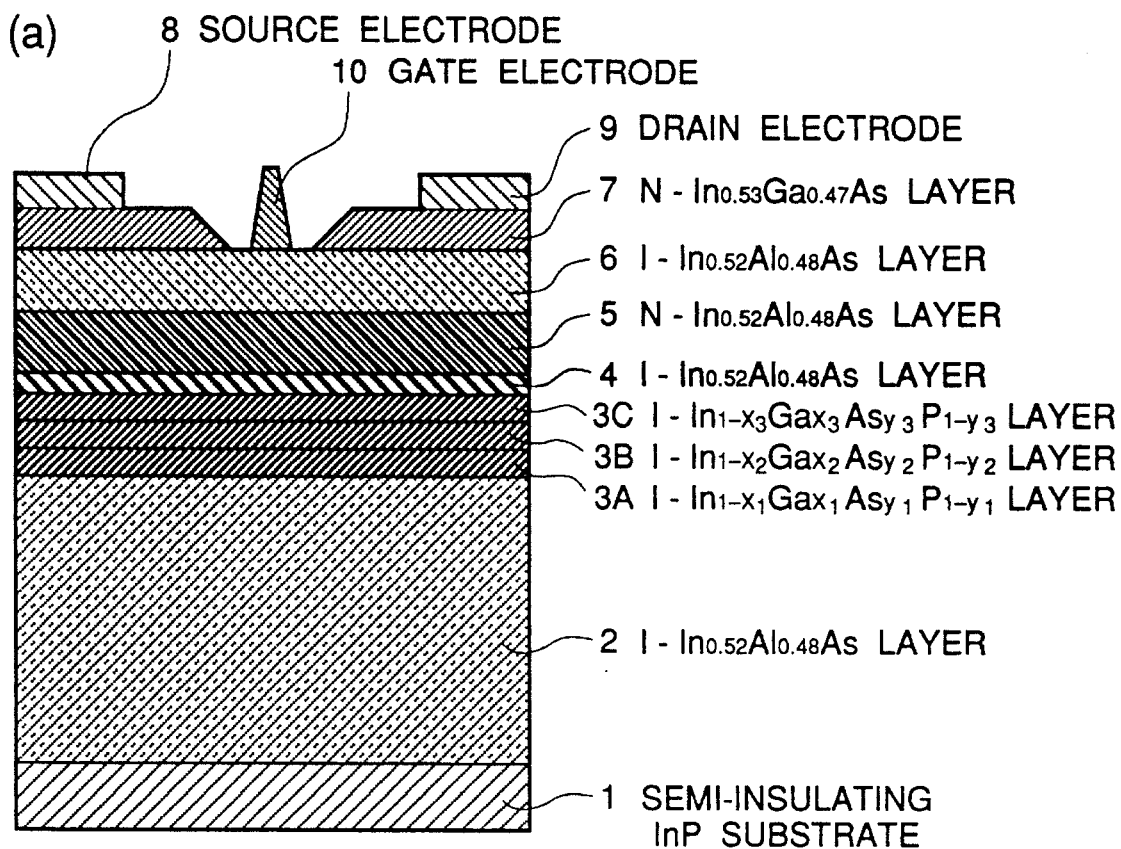
FIG. 4A is a diagrammatic sectional view of a fourth embodiment of the two-dimensional electron gas field effect transistor in accordance with the present invention.
Figure 4B:
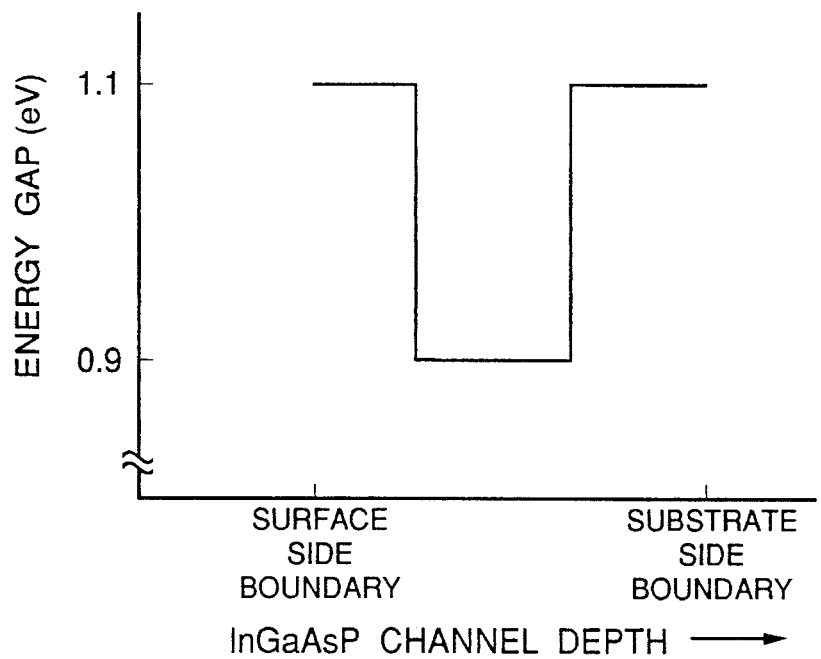
FIG. 4B is a graph illustrating the change of the energy gap in the depth directions, in the InGaAsP channel layer included in the field effect transistor shown in FIG. 4A.

Referring to FIG. 4A, there is shown a diagrammatic sectional view of a fourth embodiment of the two-dimensional electron gas field effect transistor in accordance with the present invention. In FIG. 4A, elements similar to those shown in FIG. 1A are given the same Reference Numerals, and explanation thereof will be omitted, The fourth embodiment is characterized in that the InGaAsP channel layer is composed of three layers and the composition of the InGaAsP channel layer changes in two steps in the depth direction. Namely, the channel layer is composed of a substrate side non-doped $In_{1-x1}Ga_{x1}As_{y1}P_{1-y1}$ channel layer 3A and a surface side non-doped $In_{1-x3}Ga_{x3}As_{y3}P_{1-y3}$ channel layer 3C each having the energy gap Eg of 1.1 eV, and an intermediate non-doped $In_{1-x2}Ga_{x2}As_{y2}P_{1-y2}$ channel layer 3B having the energy gap Eg of 0.9 eV. The thickness of these channel layers 3A, 3B and 3C are 15 nm, 12 nm and 3 nm.

In this fourth embodiment the InGaAsP channel layer is composed of the three layers. However, a similar effect can be obtained if the InGaAsP channel layer is formed of four or more layers.

In addition, the composition ratios "x" and "y" of the non-doped $In_{1-x}Ga_xAs_yP_{1-y}$ channel layer may not be necessarily the values that make it possible to lattice match with the InP substrate. Namely, the composition ratios "x" and "y" can be freely determined to some extent if the channel layer has a thickness thinner than a critical thickness where a misfit dislocation occurs in the strain layer.

Furthermore, the composition elements, the dopant concentration and the thickness of the buffer layer, the channel layer, the electron supply layer, the Schottky layer and the cap layer can be modified in accordance with necessity. In addition, it is possible to form a non-doped InAlAs space layer on the non-doped InGaAsP channel layer, or to uniformly dope Si to the N-type InAlAs electron supply layer, or to form another electron supply layer on the non-doped InAlAs buffer layer. The InGaAsP channel layer is ordinarily a non-doped layer, but can be doped so as to realize a high power output. The source/drain electrodes and the gate electrode can be made of metal material other than Au-Ge/Ni and Ti/Pt/Au.

As will be apparent from the above description, the two-dimensional electron gas field effect transistor in accordance with the present invention has a breakdown voltage improved in comparison with the conventional one having a uniform InGaAs channel layer. Since the two-dimensional electron gas field effect transistor in accordance with the present invention has the channel layer formed of a quaternary mixed crystal, even if the composition is modified or modulated, the crystal can be grown while maintaining the lattice matching with no limitation of the film thickness.

Accordingly, the electron density of the channel layer is elevated in the heterojunction 2DEG•FET. The deterioration of the breakdown voltage caused by the impact ionization in the high electric field operation, which was the problem in the conventional FET having the InGaAs channel layer, is greatly improved in the PET in accordance with the present invention. Furthermore, the effective drift velocity of the electrons passing in the channel layer is increased. Therefore, a high frequency characteristics is improved. For example, a cutoff frequency, a noise figure and a power gain are increased.

The invention has thus been shown and described with reference to the specific embodiments. However, it should be noted that the present invention is in no way limited to the details of the illustrated structures but changes and modifications may be made within the scope of the appended claims.

We claim:

1. A two-dimensional electron gas field effect transistor comprising a buffer layer, a channel layer, an N-type electron supply layer and a Schottky layer formed on a semi-insulating InP substrate in the named order, a gate electrode being formed in Schottky contact with said Schottky layer, a source electrode and a drain electrode being formed in ohmic contact with cap layers which are formed on said Schottky layer so as to put said gate electrode therebetween and apart therefrom, the channel layer being formed of an $In_{1-x}Ga_xAs_yP_{1-y}$ layer, wherein the values of "x" and "y" change in a depth direction of said channel layer so as to cause predetermined variation of energy gap value relative to channel depth, and wherein the values of x and y are selected to satisfy the relation $x=(0.453y)(1+0.031y)$ whereby lattice matching of said channel layer to said InP substrate is maintained throughout the thickness of said channel layer.

2. A two-dimensional electron gas field effect transistor comprising a buffer layer, a channel layer, an N-type electron supply layer and a Schottky layer formed on a semi-insulating InP substrate in the named order, a gate electrode being formed in Schottky contact with said Schottky layer, a source electrode and a drain electrode being formed in ohmic contact with cap layers which are formed on said Schottky layer so as to put said gate electrode therebetween and apart therefrom, the channel layer being formed of an $In_{1-x}Ga_xAs_yP_{1-y}$ layer, wherein the values of "x" and "y" change in a depth direction of said channel layer so as to cause predetermined variation of energy gap value relative to channel depth, said energy gap value varying from a minimum value of less than 0.95 eV to a maximum value of greater than 0.95 eV, wherein said $In_{1-x}Ga_xAs_yP_{1-y}$ channel layer has an energy gap Eg which increases in a step-by-step fashion from its surface portion near said electron supply layer to its surface portion near said buffer layer, and said energy gap of said channel layer at an interface with said buffer layer being less than that of said buffer layer.

3. A two-dimensional electron gas field effect transistor comprising a buffer layer, a channel layer, an N-type electron supply layer and a Schottky layer formed on a semi-insulating InP substrate in the named order, a gate electrode being formed in Schottky contact with said Schottky layer, a source electrode and a drain electrode being formed in ohmic contact with cap layers which are formed on said Schottky layer so as to put said gate electrode therebetween and apart therefrom, the channel layer being formed of an $In_{1-x}Ga_xAs_yP_{1-y}$ layer, wherein the values of "x" and "y" change in a depth direction of said channel layer so as to cause predetermined variation of energy gap value relative to channel depth, said energy gap value varying from a minimum value of less than 0.95 eV to a maximum value of greater than 0.95 eV, wherein said $In_{1-x}Ga_xAs_yP_{1-y}$ channel layer has a minimum energy gap at a predetermined position in the depth direction, and wherein the energy gap Eg of said $In_{1-x}Ga_xAs_yP_{1-y}$ channel layer smoothly increases from said position of said minimum energy gap to its surface portion near said electron supply layer and to its surface portion near said buffer layer, said energy gap of said channel layer at an interface with said electron supply layer being less than that of said electron supply layer, and said energy supply layer being less than that of said electron supply layer, and said energy gap of said channel layer at an interface with said buffer layer being less than that of said buffer layer.

4. A two-dimensional electron gas field effect transistor comprising a buffer layer, a channel layer, an N-type electron supply layer and a Schottky layer formed on a semi-insulating InP substrate in the named order, a gate. electrode being formed in Schottky contact with said Schottky layer, a source electrode and a drain electrode being formed in ohmic contact with cap layers which are formed on said Schottky layer so as to put said gate electrode therebetween and apart therefrom, the channel layer being formed of an $In_{1-x}Ga_xAs_yP_{1-y}$ layer, wherein the values of "x" and "y" change in a depth direction of said channel layer so as to cause predetermined variation of energy gap value relative to channel depth,.said energy gap value varying from a minimum value of less than 0.95 eV to a maximum value of greater than 0.95 eV, wherein said $In_{1-x}Ga_xAs_yP_{1-y}$ channel layer has a minimum energy gap at a predetermined position in the depth direction, and wherein the energy gap Eg of said $In_{1-x}Ga_xAs_yP_{1-y}$ channel layer increases in a step-by-step fashion from the position of said minimum energy gap to its surface portion near said electron supply layer and to its surface portion near said buffer layer, said energy gap of said channel layer at an interface with said electron supply layer being less than that of said electron supply layer, and said energy gap of said channel layer at an interface with said buffer layer being less than that of said buffer layer.

* * * * *